(12) United States Patent
Down et al.

(10) Patent No.: US 11,081,268 B2
(45) Date of Patent: Aug. 3, 2021

(54) ELECTROMAGNET ASSEMBLY

(71) Applicant: Siemens Healthcare Limited, Camberley (GB)

(72) Inventors: Alun Down, Abingdon (GB); Jonathan Noys, Abingdon (GB)

(73) Assignee: Siemens Healthcare Limited, Camberley (GB)

( * ) Notice: Subject to any disclaimer, the term of this patent is extended or adjusted under 35 U.S.C. 154(b) by 141 days.

(21) Appl. No.: 16/205,748

(22) Filed: Nov. 30, 2018

(65) Prior Publication Data

US 2019/0172619 A1 Jun. 6, 2019

(30) Foreign Application Priority Data

Dec. 1, 2017 (GB) ..................................... 1720096

(51) Int. Cl.
| | |
|---|---|
| *H01F 6/06* | (2006.01) |
| *H01F 6/00* | (2006.01) |
| *G01R 33/3815* | (2006.01) |
| *H01F 27/32* | (2006.01) |
| *G01R 33/421* | (2006.01) |
| *G01R 33/38* | (2006.01) |

(52) U.S. Cl.
CPC ......... *H01F 6/006* (2013.01); *G01R 33/3802* (2013.01); *G01R 33/3815* (2013.01); *G01R 33/421* (2013.01); *H01F 6/06* (2013.01); *H01F 27/324* (2013.01)

(58) Field of Classification Search
CPC ................. G01R 33/381–33/3815; H01F 6/06
See application file for complete search history.

(56) References Cited

U.S. PATENT DOCUMENTS 5,668,516 A * 9/1997 Xu ..................... G01R 33/3815
324/318
2007/0164743 A1 7/2007 Takamori

FOREIGN PATENT DOCUMENTS

JP H04170939 A 6/1992

* cited by examiner

*Primary Examiner* — Ramon M Barrera
(74) *Attorney, Agent, or Firm* — Schiff Hardin LLP

(57) ABSTRACT

An electromagnet assembly has an inner magnet, an outer magnet, arranged around the inner magnet with an annular region extending between the inner magnet and the outer magnet, and a number of support elements extending through the annular region and dividing the annular region into a number of annular segments. The support elements are distributed in the annular region so as to form a small annular segment and a large annular segment.

12 Claims, 3 Drawing Sheets

//ELECTROMAGNET ASSEMBLY

BACKGROUND OF THE INVENTION

Field of the Invention

The present disclosure relates to an electromagnet assembly.

In particular the disclosure is concerned with an electromagnet assembly for use in a medical imaging device.

Description of the Prior Art

In Magnetic Resonance Imaging (MRI), which is a known medical imaging technique, a main electromagnet is used to generate a strong magnetic field. In order to contain the field, it is known to employ Active Shielding wherein an additional shield electromagnet is used to "shield" the generated magnetic field. The main electromagnet and the shield electromagnet are configured in a particular spatial arrangement, with the shield magnet arranged to coaxially surround the main magnet.

For active shielding this particular spatial arrangement between the electromagnets needs to be maintained by a support structure. In certain conventional MRI scanners a number of support elements are used, while in other conventional MRI scanners a helium containment structure is used for this purpose. In either case, the support structure is arranged to be axisymmetric, reflecting the fact that generated electromagnetic loads are axisymmetric.

In addition to electromagnetic loads, the electromagnets may experience externally-caused loads along any direction and, particularly, along a radial direction. For example, loads may be caused during transportation of the magnet assembly. It is therefore ensured that the support structure is sufficiently strong to also bear such loads along any radial direction. These loads, in contrast to electromagnetic loads caused by interaction between the electromagnets, may cause local stress and strain on the magnets leading to a deformation and, ultimately, degradation in performance.

The above considerations result in an electromagnet assembly of substantial weight and cost. Hence an electromagnet assembly which has an optimal support structure, configured to provide adequate support in transit and in use while being lighter and using less materials than provided in examples of the related art is highly desirable.

SUMMARY OF THE INVENTION

The electromagnet assembly according to the invention has an inner magnet, an outer magnet arranged around the inner magnet with an annular region extending between the inner magnet and the outer magnet, and a number of support elements extending through the annular region and dividing the annular region into a number of annular segments. The support elements are distributed in the annular region so as to form a first annular segment and a second annular segment, with the first annular segment being smaller than the second annular segment.

The second annular segment may be approximately an integer multiple of the first annular segment.

Each annular segment may be approximately an integer multiple or an integer factor of another annular segment.

The outer magnet may have a number of outer support points, and the inner magnet may have a number of inner support points, with each of the support elements extending between an outer support point and an inner support point.

Each pair of adjacent inner support points may span a distance, with each distance spanned by a first pair of adjacent inner support points being an integer multiple or an integer factor of a distance spanned by a second pair of adjacent inner support points.

Each pair of adjacent outer support points may span a distance, with each distance spanned by a first pair of adjacent outer support points being an integer multiple or an integer factor of a distance spanned by a second pair of adjacent outer support points.

The number of support elements may be at least three support elements.

A first support element may be located in a first half of the annular region. A second and a third support element may be located in a second half of the annular region.

The support elements may be substantially coplanar.

The outer magnet may have a first coil and a second outer magnet coil, which is spaced apart from the outer magnet first coil, wherein the first coil is configured to define the first annular region, and the second coil defines a second annular region that extends between the inner magnet and the second coil defined by the second coil. A number of support elements may extend through the second annular region.

There may also be provided a medical imaging device comprising the electromagnet assembly as set out above.

The inventive electromagnet assembly of the medical imaging device provides greater support to the outer magnet along a vertical direction of the medical imaging device than along a horizontal direction of the medical imaging device.

The electromagnet assembly may have a larger number of support elements on a first side of the medical imaging device than on a second side of the medical imaging device.

The electromagnet assembly according to the invention has an optimized support structure, designed to provide adequate support in transit and in use while being lighter and using less materials than conventional assemblies of this type.

DESCRIPTION OF THE PREFERRED EMBODIMENTS

Figure 1:
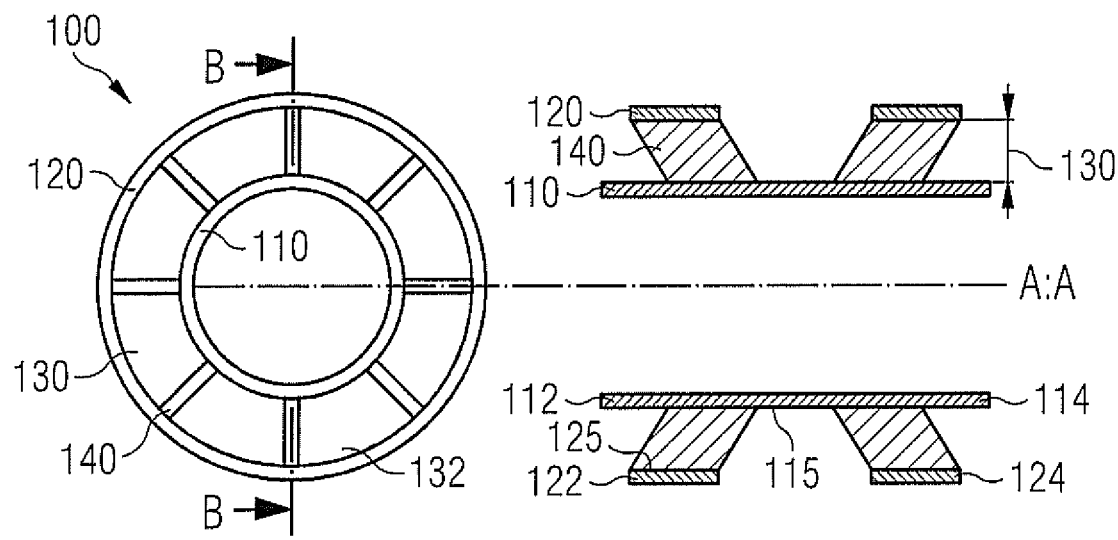
FIG. 1 is a schematic illustration of a known electromagnet assembly.

FIG. 1 shows a schematic illustration of a known electromagnet assembly 100. According to the present example, the electromagnet assembly in use forms part of a Magnetic Resonance Imaging (MRI) scanner. For such a purpose the electromagnet assembly may be contained within a housing which, in operation, contains an inert gas as a coolant, for example helium. Hence the housing forms a cryogen vessel, which enables the electromagnet assembly to be cooled to sufficiently low temperatures to optimize performance.

The electromagnet assembly 100 is substantially cylindrical, defining an assembly axis A:A, a radial direction and a circumferential direction. The electromagnet assembly extends lengthwise along the assembly axis, and possesses rotational symmetry about the assembly axis.

On the left side of FIG. 1, an axial cross-section is shown. That is, a view showing a radial plane perpendicular to the assembly axis A:A. On the right-hand side of FIG. 1, a radial cross-section is shown. That is, a view showing a plane parallel to and including the assembly axis.

The electromagnet assembly 100 is designed to generate a magnetic field and to actively shield the magnetic field when generated. The electromagnet assembly has an inner (electro-) magnet 110 and an outer (electro-) magnet 120.

The inner magnet 110, or main coil assembly 110, has a hollow cylindrical shape. A plurality of coils disposed on the inner magnet, spaced apart from each other between a first axial end 112 and a second axial end 114, and generates a magnetic field.

The outer magnet 120, or shield coil assembly 120, bounds (or "surrounds") the inner magnet 110. The outer magnet 120 is radially larger than the inner magnet and has an annular/ring shape. The inner magnet 110 and the outer magnet 120 are arranged coaxially and thus define a common assembly axis A:A. That is, axial cross-sections of the inner magnet 110 and the outer magnet 120 are concentrically arranged.

The outer magnet 120 is designed for active shielding, which involves generating a magnetic field to partially cancel the magnetic field generated by the inner magnet. The outer magnet may comprise a pair of coils 122, 124. In line with the discussed example, the coils 122, 124 are also referred to as "shield" coils 122, 124. A first shield coil 122 and a second shield coil 124 are provided, the first shield coil 122 being spaced apart from the second coil 124. More particularly, the first shield coil 122 is located toward the first end 112 of the inner magnet 110, and the second shield coil 124 is located toward the second end 114 of the inner magnet.

An annular region 130 or annular gap 130 is formed between the inner magnet 110 and the outer magnet 120. More particularly, the annular region is formed between an outer boundary (or "periphery") 115 of the inner magnet and an inner boundary (or "periphery") 125 of the outer magnet. Accordingly, the annular region 130 has a radial size determined by an inner radius extending to the outer boundary of the inner magnet 110 and an outer radius extending to the inner boundary of the outer magnet 120.

A support structure having a number of support elements 140 is located in the annular region 130. The support elements 140, or structural restraints, are provided between the inner magnet 110 and the outer magnet 120 to thereby hold the magnets 110, 120 in a substantially fixed position relative to each other. The support elements 140 provide and maintain precise positioning of the inner magnet 110 and the outer magnet 120. The support elements 140 thus provide rotational and axial support. The support elements may extend radially (with respect to the assembly axis A:A) between the inner magnet and the outer magnet. In the example shown in FIG. 1, the support elements 140 are arranged to be generally perpendicular to the inner magnet 110 and the outer magnet 120, when viewed along an axial direction or, equivalently, an axial cross-section.

The number of support elements 140 extends through the annular region 130 and thus divides the annular region 130 into a number of annular segments 132. In the example of FIG. 1, there are eight annular segments 132. The annular segments 32 are arranged uniformly, in that they are of equal size and possess equal spacing.

More particularly, the annular segments 132 are segments of the annular region 130 defined by the support elements 140 and, thus, circumferentially spaced. Accordingly, the annular segments 132 extend circumferentially, their extent delimited by the support elements 140. That is, an annular segment 132 has a first circumferential end defined by a first support element 140, and a second circumferential end defined by a second support element 140. The annular segment 132 is thus bounded by a pair of adjacent circumferentially-spaced support elements 140.

The improved support structure according to the invention has a number of support elements 240 distributed to define differently sized annular segments 232, 234 so that least one small annular segment 232 is formed, and at least one large annular segment 234 is formed. That is, the support elements 240 are circumferentially-spaced with non-uniform spacing. This has the benefit of reducing weight and cost of the support structure, as some support elements 240 may be omitted relative to the example of FIG. 1, while at the same time providing full support against expected loads and, particularly, loads along the radial direction.

Figure 2:
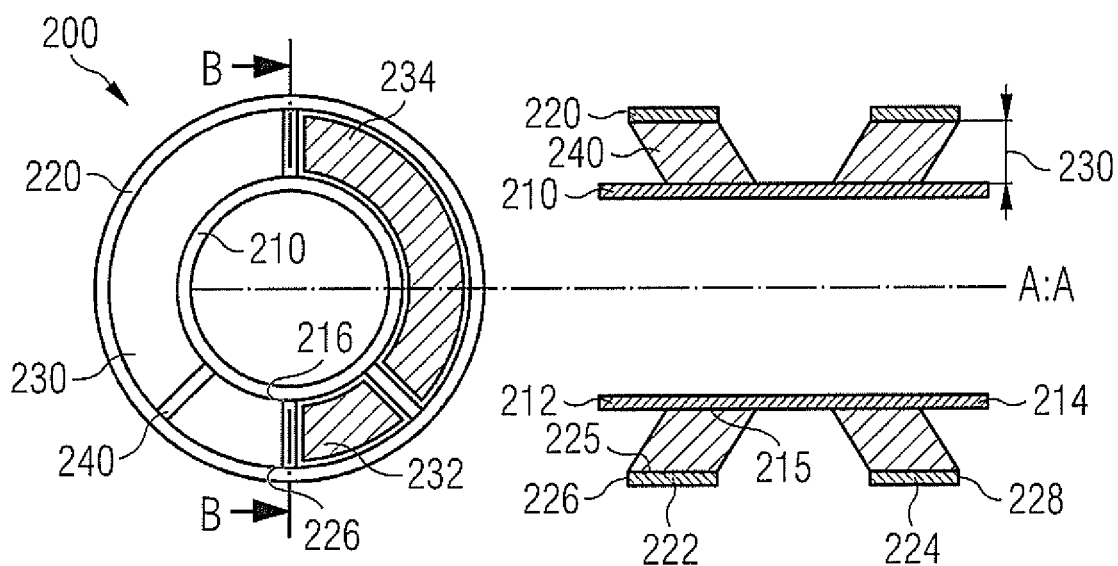
FIG. 2 shows schematic cross-sectional views of an electromagnet assembly according to the present invention.
Figure 3:
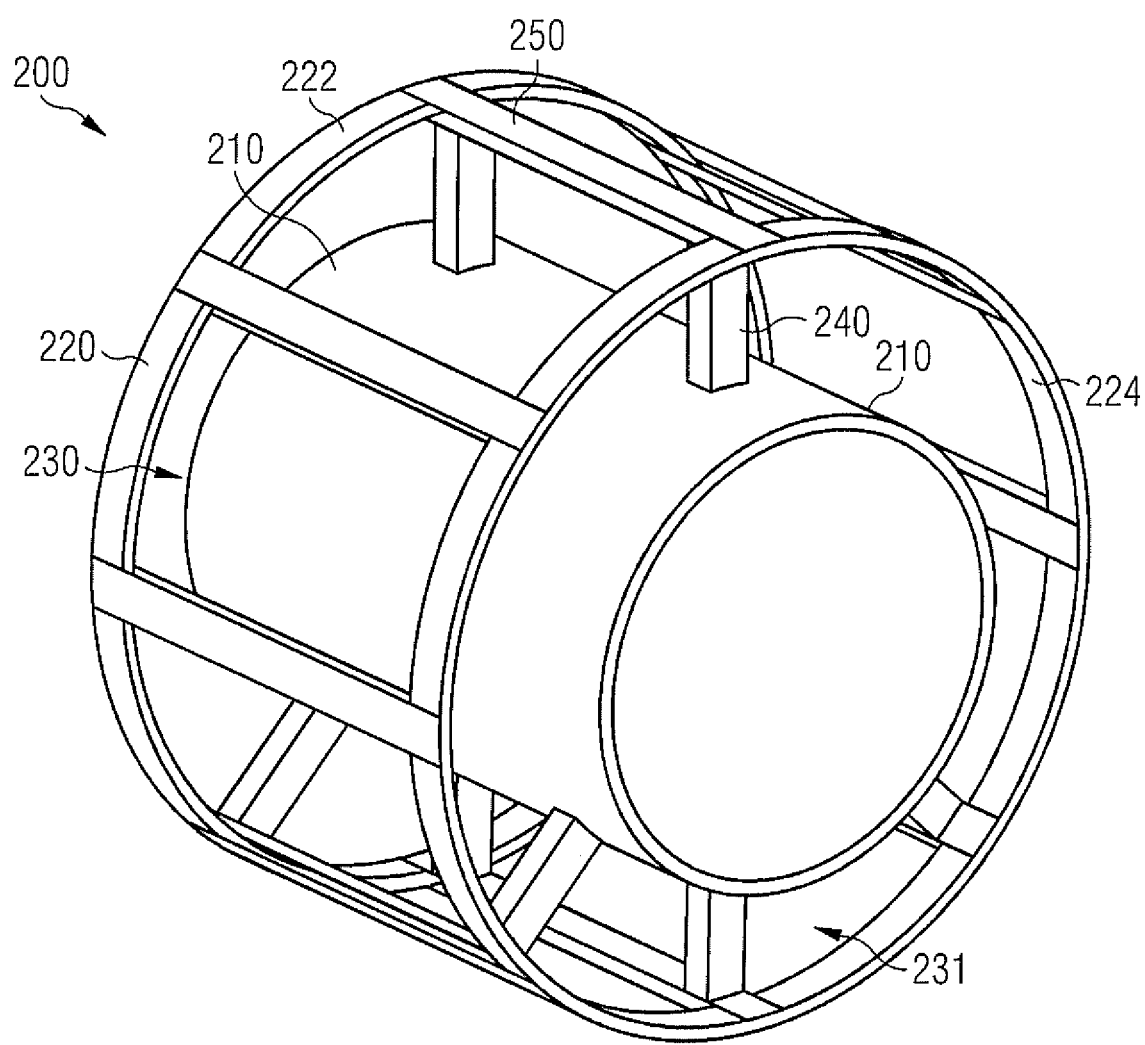
FIG. 3 is a perspective view of an electromagnet assembly according to the present invention.

FIG. 2 shows two schematic cross-sectional views of an electromagnet assembly 200 according to the present disclosure, while FIG. 3 shows a perspective view.

Some features of the assembly 200 are common to those of the known assembly 100, and hence are not described in any further detail. In particular, the electromagnet assembly 200 comprises an inner magnet 210, an outer magnet 220 arranged about the inner magnet, an annular region 230 extending between the inner magnet and the outer magnet 220, and a number of support elements 240 extending through the annular region 230 and dividing the annular region into a number of annular segments 232, 234.

A first pair of adjacent support elements 240 delimits a first annular segment 232. The adjacent support elements 240 are thus circumferentially spaced apart from one another (and hence may be termed "adjacent" or "neighboring" one another). Similarly, a second pair of adjacent support elements 240 delimits a second annular segment 234.

The first annular segment 232 is smaller than the second annular segment 234. That is to say, the first pair of adjacent support elements 240 is circumferentially spaced apart by a smaller distance than the second pair of adjacent support elements 240. Thus, the first annular segment 232 extends a shorter distance around the circumference of annular gap 230 than the second annular segment 234.

The electromagnet assembly 200 has the inner magnet 210, the outer magnet 220 arranged around the inner magnet, and an annular region 230 extending between the inner magnet 210 and the outer magnet 220. The number of support elements 240 extends through the annular region 230 and divides the annular region 230 into a number of annular segments 232, 234. Support elements 240 are distributed along the annular region to form the first annular segment 232 and the second annular segment 234. The first annular segment 232 is smaller than the second annular segment 234.

Generally, a single support element 240 has two adjacent (or "neighboring") support elements 240. Thus each support element 240 forms a pair of support elements with each of the adjacent support elements 240. That is, an individual support element 240 may belong to two pairs such as, in the example shown in FIG. 2, there is a support element 240 which belongs to the first pair of support elements 240 delimiting the small ("first") annular segment 232 and also to the second pair of support elements delimiting the large ("second") annular segment 234. Some or all of the support elements 240 may be arranged to be coplanar. According to the present example, two support elements 240 are coplanar with respect to a plane perpendicular to the assembly axis A:A.

The spacing of the support elements 240 is predetermined, at least in part, to maintain a desired spacing of the inner magnet 210 and outer magnet 220 during operation. The spacing of the supports 240, and hence relative extent of the first annular segment 232 and second annular segment 234, is thus chosen with this aim.

In the example of FIG. 2 the large annular segment 234 is a whole integer multiple of the small annular segment 232.

Figure 4:
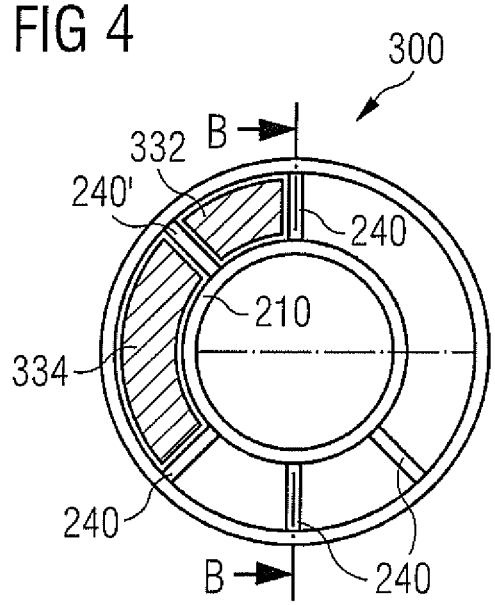
FIG. 4 is an axial view of another example of an electromagnet assembly according to the present invention.

An alternative example is shown in FIG. 4. The example of FIG. 4 is identical to that of FIGS. 2, 3 except it comprises an extra support element 240', which defines a third annular segment 332 and a fourth annular segment 334, where the third annular segment 332 is smaller than the fourth annular segment 334. However, as shown in the further example of FIG. 4, the extent of the large annular segment 334 is less than a whole integer multiple of the small annular segment 332. That is to say, the extent of the large annular segment 334 is greater than the extent of the small annular segment 332, but less than twice the extent of the small annular segment 332.

Alternatively (not shown) the extent of the large annular segment 334 may be greater than a whole integer multiple of the small annular segment 332. That is to say the extent of the large annular segment 334 may be greater than twice the extent of the small annular segment 332.

Put another way, in the examples of FIGS. 2 to 4, the large annular segments 234, 334 are greater than the extent of the small annular segment 332, and may be substantially greater than or smaller than a whole integer multiple of the small annular segments 232, 332.

In the example of FIGS. 2, 3 the support elements 240 are symmetrically arranged to either side of an axis B:B perpendicular to axis A:A such that the spacing of the support elements 240 is the same on either side of the axis B:B. In other examples, for example as shown in FIG. 4, some of the supporting elements 240 may be circumferentially spaced apart to different extents, for example such that the spacing of the support elements 240 is different on either side of the axis B:B, and/or such that the spacing of the support elements 240 varies around the annular region 230.

With reference to the example of FIGS. 2 to 4 a number of support elements 240 of the assembly 200 are omitted relative to the example of FIG. 1. Hence some annular segments are integer multiples of other, smaller annular segments.

In the example of FIGS. 2, 3 a first half of the annular region 230 includes a single support element 240, while a second half of the annular region 230 includes three support elements 240. According to the present example, the first half is an upper half while the second half is a lower half of the annular region 230. That is to say, the "upper half" is shown in the figures as above the axis A:A and the "lower half" is below the axis A:A. This may correspond to an orientation of the device in use, where the "upper half" is spaced apart from a supporting structure (e.g. a floor) by the "lower half". A first support element 240 is located in first half of the annular region 230, and at least two support elements 240 are in a second half of the annular region 230.

In the example of FIGS. 2, 3, the large annular segment 234 is approximately three times larger than the small annular segment 232, wherein the individual widths of the support elements 240 (as measured along the circumferential direction) have been disregarded. That is, the large annular segment 234 has a circumferential length, i.e. a length as measured along the circumferential direction, which is approximately three times larger than a circumferential length of the small annular segment 232. More precisely, the large annular segment 234 is substantially three times the small annular segment 232 plus two times the width of a single support element 240.

Every pair of adjacent support elements 240 spans an angle. Disregarding the width of the individual support elements 240, in the example of FIGS. 2, 3 the small annular segment 232 corresponds to an angle of 45° (or "deg", denoting degree of an arc), and the large annular segment 234 corresponds to an angle of 135°.

The electromagnet assembly of the present disclosure comprises three or more support elements 240, wherein a first angle is spanned by a first pair of adjacent support elements 240, a second angle is spanned by a second pair of adjacent support elements 240, and the first angle differs from the second angle.

The support elements 240 are fixed to the inner magnet 210 and the outer magnet 220 by suitable means, for example mechanically. The inner magnet 210 may have a number of inner support points 215, and the outer magnet 220 comprises a plurality of outer support points 225. According to the present example, an individual support element 240 extends from an inner support point 215 to an outer support point 225, and according to some examples each support element 240 may extend between an outer support point 225 and an inner support point 215.

Each pair of adjacent inner support points 215 spans a distance. This distance is measured along the outer boundary of the inner magnet 210 and, in particular, along the circumferential direction. Each distance spanned by a first pair of adjacent inner support points 215 is an integer multiple or an integer factor of a distance spanned by a second pair of adjacent inner support points 215. Conveniently, either the integer multiple or the integer factor may exclude the integer being equal to unity.

Similarly, each pair of adjacent outer support points 225 spans a distance. According to some examples, each distance spanned by a first pair of adjacent outer support points 215 is an integer multiple or an integer factor of a distance spanned by a second pair of adjacent outer support points 225.

According to the present example of FIGS. 2, 3, each annular segment 232, 234 approximately corresponds to an integer multiple or an integer factor of another annular segment 232, 234. Each large annular segment 234 may be an integer multiple of any one of the small annular segments 232. Similarly, each small annular segment 232 may be an integer factor of any large annular segment 234.

The support elements 240 are arranged to be substantially perpendicular to the inner magnet 210 as well as the outer magnet 220, when viewed along an axial direction. The support elements need not, however, be perpendicular to the axis A:A, as shown in FIG. 2.

Similar to the known assembly 100, the inner magnet 210 comprises a first (axial) end 212 and a second (axial) end 214, which delimit the inner magnet along the assembly axis A:A. Analogously, the outer magnet 220 comprises a first (axial) end 226 and a second (axial) end 228, which delimit the outer magnet along the assembly axis.

The electromagnet assembly 200 is a structure for generating a high magnetic field under superconducting conditions, and is therefore of a precise design and manufactured within small tolerances. When the assembly is subjected to shock or vibration loads, it is important to mitigate these loads in order to prevent, for example, distortion of the relative positions of the inner magnet 210 and the outer magnet 220 to maintain performance of the assembly.

During transportation of the electromagnet assembly 200, or a device comprising the assembly, the most significant shock loading may in the vertical orientation. To manage the distortion and stress exhibited by the magnets due to vertically oriented loading, the support elements 240 are concentrated in a portion of the annular region 230 corresponding to a vertical region, either the lower vertical region or the upper vertical region. This causes the loads to be dominated by tension or compression of the support elements, rather than bending. At the same time, support elements carrying non-significant support loads are removed from the electromagnet assembly to reduce the mass and cost of the structure.

Moreover, ferromagnetic materials may be present around the electromagnet assembly 200 when installed. These ferromagnetic materials may serve various purposes, for example as structural features of a building or magnetic shielding. However, electromagnetic attraction between the electromagnet assembly and the ferromagnetic materials may be caused, which in turn can cause local stress and strain of the electromagnet assembly. If the assembly is unsupported against such attraction, a degradation in performance can result. Hence support elements may be distributed in the annular region 230 dependent on the properties of the building or other structure in which the electromagnet assembly is to be installed. For example, a number of support elements 240 may be closely spaced along a horizontal direction, with respect the device in which the assembly is contained, in order to support against horizontal attraction to a ferromagnetic building wall/floor.

Furthermore, considerations relating to ferrous materials in surrounding structures become increasingly important with increasing magnet strength. High and ultra-high magnetic fields generated by current electromagnet technology may exceed 7 T (tesla) and may therefore be very susceptible to distortions resulting from attraction between the magnets and surrounding ferrous material. An increasingly complex and massive support structure, however, is advantageously avoided because otherwise the electromagnet assembly and/or a device, such as an MRI scanner, have to be shipped in parts, assembled and cooled. This potentially adds weeks of delay between shipping and operation of the device and may add substantial costs. By contrast, the electromagnet assembly 200 according to the present disclosure provides for a sufficiently strong support between the magnets and, at the same time, reduced weight. An MRI scanner, or other device, comprising the assembly may therefore be shipped as a whole unit.

The electromagnet assembly 200 as shown in FIG. 2 has support elements 240 which are arranged non-uniformly, whereas according to the known example of FIG. 1 support elements 140 are arranged uniformly. Non-uniformity of the distribution of support elements is not intended to preclude rotational symmetry. Although the electromagnet assembly 200 does not possess rotational symmetry, it is envisaged that certain examples may. Such example assemblies may be symmetric with respect to a rotation of, for example, 120° or a rotation of 180°.

As shown in FIG. 3, the electromagnet assembly 200 comprises the outer magnet 220 comprises a pair of coils 222, 224. A first coil 222 is located towards the first end 212 of the inner magnet 210, and a second coil 224 is located towards the second end 214 of the inner magnet. A plurality of axial reinforcing elements 250, or reinforcement members 250, extends between the pair of coils. The reinforcing members 250 provide additional support of the outer magnets 220, particularly against forces along the assembly axis A:A which may include electromagnetic forces exerted as part of active shielding. In such examples, where the coils are configured for active shielding, the coils may alternatively be referred to as "shield" coils 222, 224.

Conveniently, the number of reinforcing members 250 is greater than the number of radial support elements 240. According to the present example, there are eight reinforcing members 250. The spacing between a pair of adjacent reinforcing members 250 may correspond to the small annular segment 232.

An annular region 230, 231 is defined by each shield coil 222, 224 and the inner magnet 210. Two sets of support elements 240 are provided, each set supporting a different shield coil 222, 224 relative to the inner magnet 210. That is to say, the first shield coil 222 defines a first annular region 230 and the second shield coil 224, which is axially spaced from the first shield coil 222, defines a second annular region 231 which extends between the inner magnet 210 and the second coil 224. A set of support elements 240 is provided in each annular region 230, 231 to provide support to the corresponding shield coil 222, 224.

Figure 5:
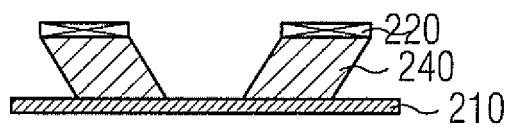
FIG. 5 is a schematic cross-sectional view of another embodiment of the support structure according to the invention.
Figure 6:
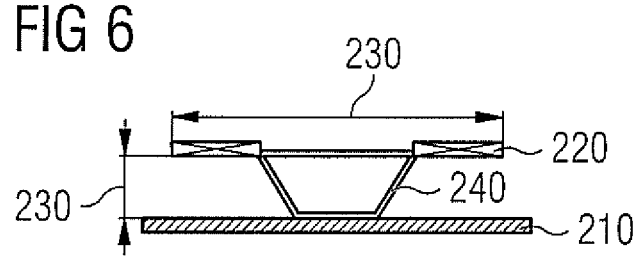
FIG. 6 is a schematic cross-sectional view of another embodiment of the support structure according to the invention.
Figure 7:
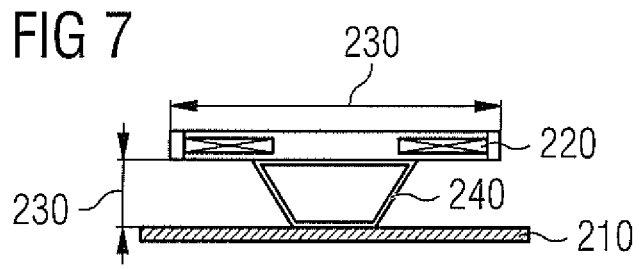
FIG. 7 is a schematic cross-sectional view of another embodiment of the support structure according to the invention.

FIGS. 6 and 7 show alternatives for providing radial support to the electromagnet assembly 200. According to the earlier example, illustrated in FIG. 5, radial supports are provided such that they are spaced apart axially (i.e. along the Axis A:A). Alternatively, as shown in FIGS. 6 and 7, radial support may be provided as a single structure. In such an example, a single annular region 240 is considered to be defined, including both outer magnets 220.

According to another alternative, shield coil support may be provided through local fixings, shown in FIG. 5, or a journal, shown in FIG. 6.

Although the examples discussed above have four support elements 240, it is envisaged that any plurality of support elements of at least three may be used in an electromagnet assembly.

A medical imaging apparatus according to the invention has a medical image data acquisition scanner with an electromagnet assembly 200, as described above, therein. The electromagnet assembly 200 is arranged to provide greater support to the outer magnet 220 along a vertical direction (e.g. Axis B:B) of the medical imaging scanner than along a horizontal direction (e.g. Axis A:A) of the medical imaging device.

Hence the medical imaging scanner may be considered as having a "first side" (which may be the "lower half" described above) and a "second side" (which may be the "upper half" described below). Thus the first side may be opposite to the second side across the axis A:A to define vertical sides. Put another way, the first side may be separated from the second side by a horizontal axis.

Alternatively the first side may be opposite to the second side across the axis B:B to define "horizontal sides". That is to say, the first side may be separated from the second side by a vertical axis.

Hence the first side and the second side are "sides" delimiting the device along the radial direction of the electromagnet assembly.

Hence according to the present invention, the medical imaging apparatus is designed so that the electromagnet assembly has a larger number of support elements 240 on the first side of the scanner than on the second side, or has a fewer number of support elements 240 on the first side than on the second side.

According to an embodiment, the electromagnet assembly has a greater number of support elements 240 on a first horizontal side of the scanner than on a second horizontal side.

The support elements 240 on the first horizontal side may be orientated to support along the vertical direction rather than along the horizontal direction.

Generally, the structure of an electromagnet assembly is dominated by the large electromagnetic loads generated by the electromagnets, and is designed and constructed to be axisymmetric. Any directional load conditions are assumed to act in any direction, and hence designs are made axisymmetric. As structures are made more efficient as to material and cost, non-axisymmetric loading becomes increasingly significant. Conventional active shield coil support is achieved through radial support elements, or use of the helium containment structure, both of which are axisymmetric. Both of these structures are inefficient on material and cost, since they provide full support at a level suitable for the high vertical load conditions. By contrast, the electromagnet assembly 200 according to the present disclosure improves on these considerations.

The electromagnet assembly is designed to provide adequate support in transit and in use. Expected loads when in use, for example an external load generated through interaction with the site of operation of the electromagnet, can be accommodated by including support elements 240 arranged to support against these expected loads. Such an arrangement may be particularly desirable where large loads are caused along a particular radial direction of the electromagnet assembly, for example due to the presence of ferromagnetic material in a supporting floor, or adjacent wall, ceiling or other nearby structure Support elements 240 are omitted from regions where it is expected no support against loads on the electromagnets is required. The resulting electromagnet assembly is therefore less complex, simplifying its manufacturing and reducing the amount of materials required for its manufacture. Hence the resulting electromagnet assembly is generally lighter, which may be advantageous for transportation as well as operation of the electromagnet assembly.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. An electromagnet assembly for generating a strong magnetic field under superconducting conditions, comprising:
    an inner magnet;
    an outer magnet around the inner magnet, with an annular region extending between the inner magnet and the outer magnet;
    a plurality of support elements extending through the annular region and dividing the annular region into a plurality of annular segments; and
    said support elements being distributed in the annular region so as to form a first annular segment and a second annular segment, with the first annular segment being smaller than the second annular segment,
    wherein the outer magnet comprises:
        a first coil;
        a second coil spaced apart from the first coil;
        the first coil defining a first annular region;
        the second coil defining a second annular region that extends between the inner magnet and the second coil; and
        a plurality of support elements through the second annular region.

2. The electromagnet assembly according to claim 1, wherein the second annular segment is an integer multiple of the first annular segment.

3. The electromagnet assembly according to claim 1, wherein each annular segment is an integer multiple or an integer factor of another annular segment.

4. The electromagnet assembly according to claim 1, wherein:
    the outer magnet comprises a plurality of outer support points;
    the inner magnet comprises a plurality of inner support points; and
    each of the support elements extends between an outer support point and an inner support point.

5. The electromagnet assembly according to claim 4, wherein:
    each pair of adjacent inner support points spans a distance; and
    each distance spanned by a first pair of adjacent inner support points is an integer multiple or an integer factor of a distance spanned by a second pair of adjacent inner support points.

6. The electromagnet assembly according to claim 4, wherein:
    each pair of adjacent outer support points spans a distance; and
    each distance spanned by a first pair of adjacent outer support points is an integer multiple or an integer factor of a distance spanned by a second pair of adjacent outer support points.

7. The electromagnet assembly according to claim 1, wherein the plurality of support elements comprises at least three support elements.

8. The electromagnet assembly according to claim 1, wherein:
    a first support element is located in a first half of the annular region; and
    a second support element and a third support element are located in a second half of the annular region.

9. The electromagnet assembly according to claim 1, wherein the support elements are coplanar.

10. A medical imaging apparatus comprising:
    a medical image data acquisition scanner;
    an electromagnetic assembly in said scanner that generates a strong magnetic field under superconducting conditions; and
    said electromagnetic assembly comprising an inner magnet, an outer magnet around the inner magnet, with an annular region extending between the inner magnet and the outer magnet, a plurality of support elements extending through the annular region and dividing the annular region into a plurality of annular segments, and said support elements being distributed in the annular region so as to form a first annular segment and a second annular segment, with the first annular segment being smaller than the second annular segment,
wherein the outer magnet comprises:
   a first coil;
   a second coil spaced apart from the first coil;
   the first coil defining a first annular region;
   the second coil defining a second annular region that extends between the inner magnet and the second coil; and
   a plurality of support elements extending through the second annular region.

11. The medical imaging apparatus according to claim 10, wherein the electromagnet assembly provides greater support to the outer magnet along a vertical direction of the medical imaging scanner than along a horizontal direction of the medical imaging scanner.

12. The medical imaging apparatus according to claim 10, wherein the electromagnet assembly has a larger number of support elements on a first side of the medical imaging scanner than on a second side of the medical imaging scanner.

\* \* \* \* \*